(12) United States Patent
Liu et al.

(10) Patent No.: US 9,793,366 B2
(45) Date of Patent: Oct. 17, 2017

(54) ARRAY SUBSTRATE, METHOD OF FABRICATING THE SAME, DISPLAY PANEL AND DISPLAY DEVICE

(71) Applicant: BOE TECHNOLOGY GROUP CO., LTD., Beijing (CN)

(72) Inventors: Zheng Liu, Beijing (CN); Dong Li, Beijing (CN); Xiaolong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/131,175

(22) Filed: Apr. 18, 2016

(65) Prior Publication Data
US 2016/0343736 A1     Nov. 24, 2016

(30) Foreign Application Priority Data
May 21, 2015   (CN) .......................... 2015 1 0263070

(51) Int. Cl.
*H01L 29/423*     (2006.01)
*H01L 29/49*      (2006.01)
(Continued)

(52) U.S. Cl.
CPC ...... *H01L 29/42372* (2013.01); *H01L 27/124* (2013.01); *H01L 27/1244* (2013.01);
(Continued)

(58) Field of Classification Search
CPC .............. H01L 27/124; H01L 27/1248; H01L 27/1244; H01L 27/1259; H01L 27/1262; H01L 27/1288; H01L 27/32; H01L 29/41733; H01L 29/42372; H01L 29/4908; H01L 29/4958; H01L 27/3225; H01L 27/3248
See application file for complete search history.

(56) References Cited

U.S. PATENT DOCUMENTS 9,595,691 B2 * 3/2017 Jung .................... H01L 51/5262
2006/0243980 A1 11/2006 Lee

FOREIGN PATENT DOCUMENTS

| CN | 100440014 C  | 12/2008 |
| CN | 104253245 A  | 12/2014 |
| KR | 20150033444 A | 4/2015 |

OTHER PUBLICATIONS

First Chinese Office Action dated May 18, 2017.

* cited by examiner

*Primary Examiner* — Thanhha Pham
(74) *Attorney, Agent, or Firm* — Dilworth & Barrese, LLP; Michael J. Musella

(57) ABSTRACT

An array substrate, a method for fabricating the same, a display panel and a display device are disclosed. The array substrate comprises a display area and a non-display area that is outside the display area. The method comprises: forming a metal layer on a base substrate, the metal layer comprising a conductive pattern in the display area and a first electrode in the non-display area; forming a protective layer on the metal layer, a thickness of the protection layer in the non-display area being less than a thickness of the protection layer in the display area; forming a display electrode layer on the protection layer and removing the display electrode layer in the non-display area; and removing the protection layer in the non-display area.

12 Claims, 3 Drawing Sheets non-display area display area

(51) Int. Cl.
*H01L 27/12* (2006.01)
*H01L 27/32* (2006.01)
*H01L 29/66* (2006.01)
*H01L 29/45* (2006.01)
*H01L 29/786* (2006.01)

(52) U.S. Cl.
CPC ...... *H01L 27/1259* (2013.01); *H01L 27/1262* (2013.01); *H01L 27/1288* (2013.01); *H01L 27/32* (2013.01); *H01L 27/3225* (2013.01); *H01L 27/3248* (2013.01); *H01L 29/458* (2013.01); *H01L 29/4908* (2013.01); *H01L 29/4958* (2013.01); *H01L 29/4966* (2013.01); *H01L 29/66765* (2013.01); *H01L 29/78678* (2013.01)

ARRAY SUBSTRATE, METHOD OF FABRICATING THE SAME, DISPLAY PANEL AND DISPLAY DEVICE

TECHNICAL FIELD

At least one embodiment of the present disclosure relates to an array substrate, a method for fabricating the same, a display panel and a display device.

BACKGROUND

Organic electroluminescent display device, due to advantages such as high brightness, high contrast ratio, wide viewing angle and fresh color, is widely concerned and gradually applied in various fields at present.

In the organic electroluminescent display device, an array substrate is provided with a source-drain electrode metal layer in a non-display area and the source-drain electrode metal layer is employed to connect data lines in a display area with an outside drive circuit. In addition, in the organic electroluminescent display device, the display area of the array substrate comprises a display electrode and the display electrode for example is a metal layer, a transparent electrode layer, or a combination of the metal layer and the transparent electrode layer. The metal layer for example is formed of silver or silver alloy, and the transparent electrode layer for example is formed of transparent conductive oxide (such as ITO). In a process of forming the display electrode by etching (for example, a wet-etching is generally employed), primary cell effect is likely to occur so that the source-drain electrode metal layer in the non-display area is damaged, hence reducing yield rate of display devices. So-called primary cell effect (galvanic effect) refers to a phenomenon that metals with different activity or metal and other conductive material (such as non-metal material or oxides) having different activity are immersed into electrolyte solution (for example, acidic substance such as sulfuric acid, hydrogen peroxide) and a redox reaction occurs, so that the metal with a higher activity (namely, with a strong reducibility) is oxidized and corroded.

To solve the above problem, it is considered to employ special material, such as titanium or a laminate structure of titanium and other metals, to form the source-drain electrode metal layer, so as to increase anti-corrosion property of the source-drain electrode metal layer. However, it is of high cost to employ titanium or the laminate structure of titanium and other metals; in addition, it is needed to develop new deposition and patterning process, which further increases manufacturing cost.

SUMMARY

According to embodiments of the present disclosure, a method for fabricating an array substrate is provided. The array substrate comprises a display area and a non-display area that is outside the display area. The method comprises: forming a metal layer on a base substrate, the metal layer comprising a conductive pattern in the display area and a first electrode in the non-display area; forming a protective layer on the metal layer, a thickness of the protection layer in the non-display area being less than a thickness of the protection layer in the display area; forming a display electrode layer on the protection layer and removing the display electrode layer in the non-display area; and removing the protection layer in the non-display area.

According to the embodiments of the present disclosure, an array substrate is provided. The array substrate is fabricated by the fabrication method described above.

According to the embodiments of the present disclosure, a display panel is provided. The display panel comprises the above array substrate.

According to the embodiments of the present disclosure, a display device is provided. The display device comprises the above display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and, it is not limitative to the scope of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

A method for fabricating an array substrate is provided according to embodiments of the present disclosure. The array substrate comprises a display area and a non-display area outside the display area. For example, the non-display area is disposed to surround the display area.

For example, in the display area, data lines and gate lines are provided in a cross manner to define a plurality of pixel units.

For the array substrate of a liquid crystal device, each pixel unit comprises a display electrode and a thin film transistor that is configured to drive the display electrode. The display electrode is, for example, a pixel electrode. A drain electrode of the thin film transistor is connected with the display electrode, a gate electrode of the thin film transistor is connected with the gate line, and a source electrode of the thin film transistor is connected with the data line.

For the array substrate of an organic electroluminescent display device, each pixel unit comprises a display unit and a thin film transistor that is configured to drive the display unit. The display unit comprises a pair of display electrodes and a light-emitting layer that is provided between the pair of the display electrodes. A drain electrode of the thin film transistor is connected with one of the pair of the display electrodes, a gate electrode of the thin film transistor is connected with the gate line, and a source electrode of the thin film transistor is connected with the data line. For example, each display electrode of the pair of the display electrodes is formed of a metal layer, a transparent conductive layer or a combination of the metal layer and the transparent conductive layer.

Figure 1:
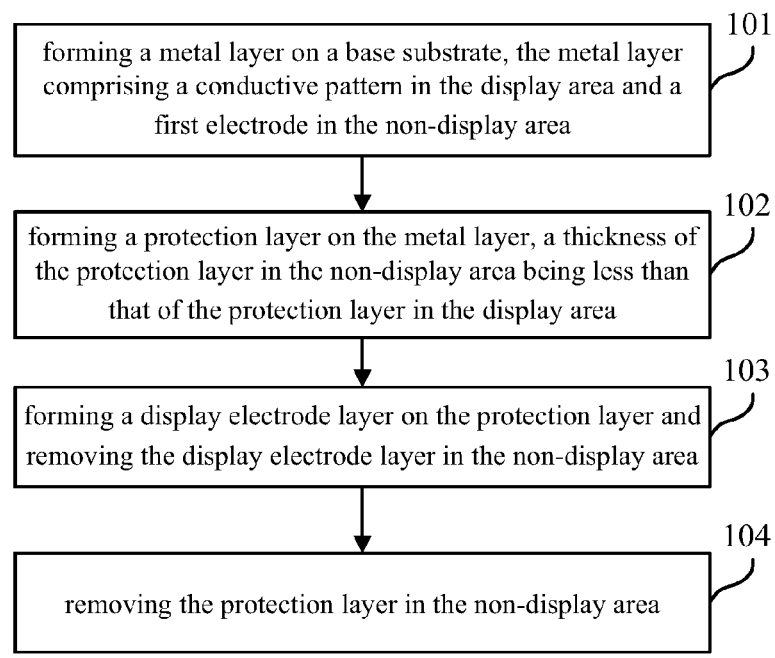
FIG. 1 is a process flow chart illustrating a fabrication method of an array substrate according to embodiments of the present disclosure.

Referring to FIG. 1, the method for fabricating the array substrate according to the embodiments of the present disclosure comprises:

101, forming a metal layer on a base substrate, the metal layer comprising a conductive pattern in the display area and a first electrode in the non-display area.

For example, the first electrode in the non-display area is connected with the conductive pattern in the display area to connect the conductive pattern in the display area to an outside drive circuit.

For example, the metal layer is a source-drain electrode metal layer. Under such a case, the conductive pattern in the display area comprises, for example, the source electrode and the drain electrode of the thin film transistors as well as the data line. For example, the first electrode is connected with the data line so that the data line is connected with the outside drive circuit.

For example, the metal layer is a gate electrode metal layer, under such a case, the conductive pattern in the display area comprises, for example, the gate electrode of the thin film transistor and the gate line. For example, the first electrode is connected with the gate line so as to connect the gate line with the outside drive circuit.

Firstly, a metal film is formed. For example, the metal film is of a single-layered structure formed of any one of aluminum, molybdenum and tungsten, or the metal film is of a multi-layered structure formed of at least two of aluminum, molybdenum and tungsten, or the metal film is formed of an alloy of at least two of aluminum, molybdenum and tungsten. In the embodiments of the present disclosure, it is not needed to select special anti-corrosion material to form the metal film.

And then, a patterning process is performed to pattern the metal thin film, so as to form the metal layer comprising the first electrode and the conductive pattern.

For example, a thickness of the metal layer is 1000 angstrom to 5000 angstrom.

102, forming a protection layer on the metal layer, a thickness of the protection layer in the non-display area being less than that of the protection layer in the display area.

For example, a planarization film is formed on the metal layer and a patterning process is then performed on the planarization film to form the protection layer, and the thickness of the protection layer in the non-display area is formed to be less than that of the protection layer in the display area.

According to practical requirements, a part of the planarization film has to be removed; for example, a part of the planarization film is removed to form via holes. Under such a case, for example, a half-tone mask (for example, a double-tone mask or a grey-tone mask) is employed to perform the patterning process on the planarization film, so that the protection layer is formed and the thickness of the protection layer in the non-display area is less than the thickness of the protection layer in the display area.

For example, an organic photoresist material is employed to form the planarization film with a thickness of 8000 angstrom to 20000 angstrom on the metal layer, and the patterning process with using the half-tone mask process is performed to reduce the thickness of the protection layer in the non-display area to a range from 1000 angstrom to 8000 angstrom. Of course, the thickness of the protection layer in the non-display area is not limited thereto, as long as the protection layer in the non-display area is as thin as possible on the basis of preventing the first electrode from being damaged in the following etching process.

A wet etching is for example employed in follow-up etching process to form the display electrode, so that the protection layer in the non-display area prevents the primary cell effect between the display electrode and the first electrode, thus avoiding oxidization of the first electrode due to the primary cell effect so as to prevent the first electrode from being damaged.

Under a case that the planarization film is formed of the organic photoresist material, the protection layer is formed by exposure and development without an etching process.

Because the thickness of the protection layer in the non-display area is less than the thickness of the protection layer in the display area, it is easy to remove the protection layer in the non-display area in following process to expose the first electrode, which will not influence the protection player in the display area.

103, forming a display electrode layer on the protection layer and removing the display electrode layer in the non-display area.

For example, an electrode film is formed on the protection layer via a sputtering or evaporation process and patterning of the electrode film is performed via a patterning process to form the display electrode layer and remove the display electrode layer in the non-display area.

For example, in the step, the display electrode layer in the non-display area is completely removed.

For example, if a part of the display electrode layer in the non-display area is to be retained, a pixel defining layer described in a following step 104 is formed to block the part of the display electrode layer to be retained.

For example, the display electrode layer is a laminate structure of ITO (indium tin oxide) layer and a metal layer, and the metal layer is a silver layer or a silver alloy layer. The display electrode layer, for example, is a laminate structure with the ITO layer formed above the silver film layer. The electrode layer, for example, is a laminate structure with the ITO layer formed below the silver alloy layer.

For example, a thickness of the display electrode layer is 1000 angstrom to 5000 angstrom. For example, the thickness of the display electrode layer is 1500 angstrom to 4000 angstrom.

104, removing the protection layer in the non-display area.

For example, the protection layer in the non-display area is removed via a etching process.

For example, under a case that the protection layer is formed of the organic photoresist material, an ashing process is employed to remove the protection layer in the non-display area.

For example, the pixel defining layer is formed on the display electrode layer, and the ashing process with the pixel defining layer being taken as a mask is employed to remove the protection layer in the non-display area.

For example, the protection layer in the non-display area is removed completely or partially. Under a case that the protection layer in the non-display area is removed completely, the pixel defining layer is merely formed in the display area to expose the entire protection layer in the non-display area. Under a case that the protection layer in the non-display area is partially removed, the pixel defining layer is formed in the display area and the non-display area to expose a part of the protection layer in the non-display area.

In the embodiments of the present disclosure, the protection layer in the non-display area is removed via the ashing process, so that an etching process is avoided, thus avoiding adverse influences on the first electrode caused by the etching process.

For example, in the array substrate of the organic electroluminescent display device, low temperature poly-silicon is employed to fabricate an active layer of the thin film transistor and the low temperature poly-silicon is of high mobility (hundreds of times than that of non-crystal silicon) with respect to amorphous silicon. In addition, under a case that low temperature poly-silicon is employed to fabricate the active layer of the thin film transistor, the thin film transistor is able to be made with a small size and a fast response speed.

To explicitly describe the fabrication method of the array substrate according to the embodiments of the present disclosure, the method for fabricating the array substrate according to the embodiments of the present disclosure will be described in detail in combination with FIG. 2 to FIG. 7. For example, the case that the metal layer is the source-drain electrode layer is taken as an example for description.

Figure 2:
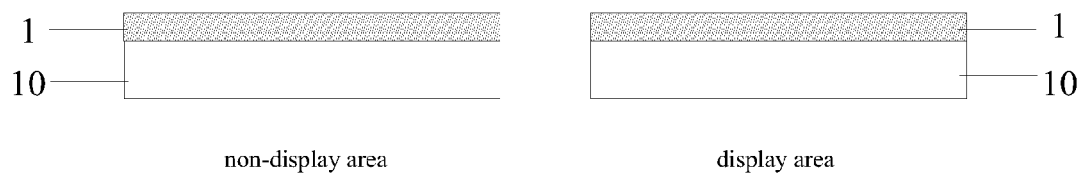
FIG. 2 is a schematic structural view illustrating forming a metal layer according to the embodiments of the present disclosure.

Referring to FIG. 2, the source-drain electrode metal layer 1 is formed on a base substrate 10.

Figure 3:
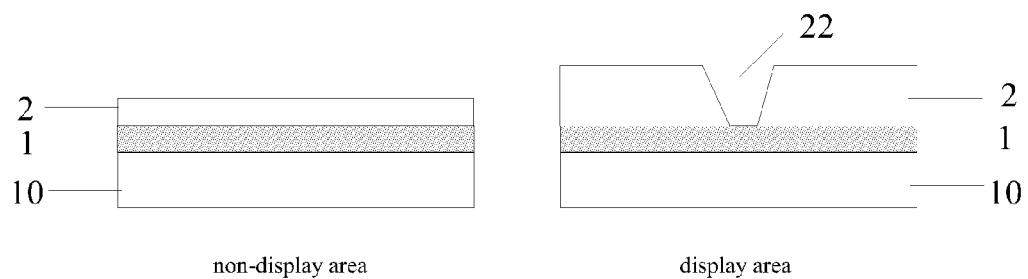
FIG. 3 is a schematic structural view illustrating forming a protection layer according to the embodiments of the present disclosure.

Referring to FIG. 3, after the planarization film is formed on the source-drain electrode metal layer 1, patterning of the planarization film is performed via the half-tone mask to form the protection layer 2. The thickness of the protection layer in the non-display area is less than that of the protection layer in the display area. For example, in the display area, the via hole 22 is formed in the protection layer and the via hole is employed to connect the drain electrode of the thin film transistor with the display electrode.

Figure 4:
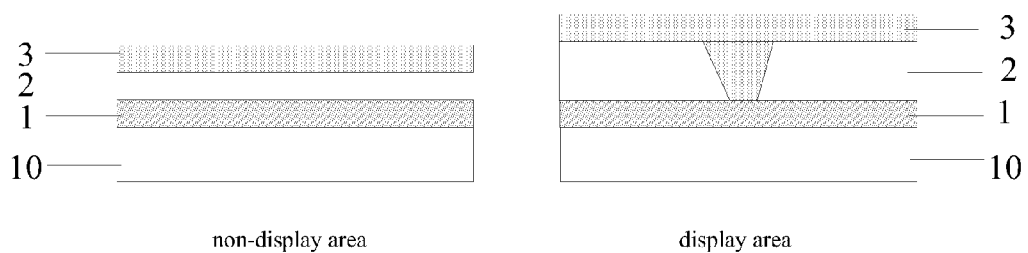
FIG. 4 is a schematic structural view illustrating forming a display electrode layer according to the embodiments of the present disclosure.
Figure 5:
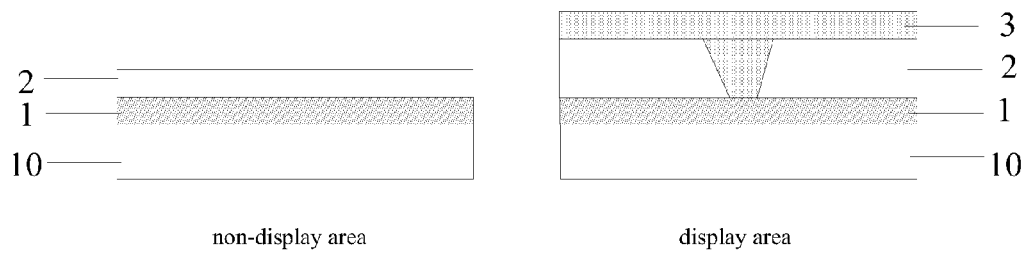
FIG. 5 is a schematic structural view illustrating removing the display electrode layer in a non-display area according to the embodiments of the present disclosure.

Referring to FIG. 4 and FIG. 5, the display electrode layer 3 is formed on the protection layer 2 and the display electrode layer 3 in the non-display area is removed. For example, the electrode film is formed via sputtering or evaporation, and the patterning process is then performed on the electrode film to form the display electrode layer 3 and the display electrode layer in the non-display area is removed. For example, the patterning process includes steps such as exposure, development and etching. In the step, the protection layer 2 protects the source-drain electrode metal layer 1 and insulates the source-drain electrode metal layer 1 from the display electrode layer 3, so that the source-drain electrode metal layer 1 is not corroded, which avoids damage of the source-drain electrode metal layer 1 due to primary cell effect.

Figure 6:
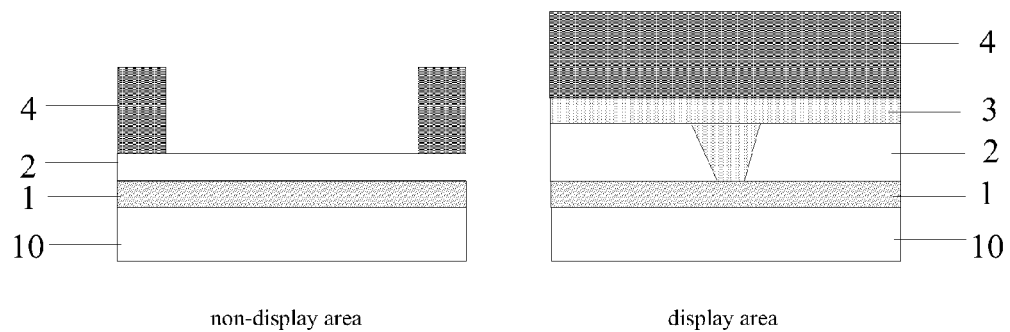
FIG. 6 is a schematic structural view illustrating forming a pixel defining layer according to the embodiments of the present disclosure.

Referring to FIG. 6, the pixel defining layer 4 is formed on the display electrode layer 3 and the pixel defining layer 4 is taken as a mask to remove the protection layer 2 in the non-display area. For example, the ashing process is employed to remove the protection layer 21 that is not covered by the pixel defining layer 4 in the non-display area.

Figure 7:
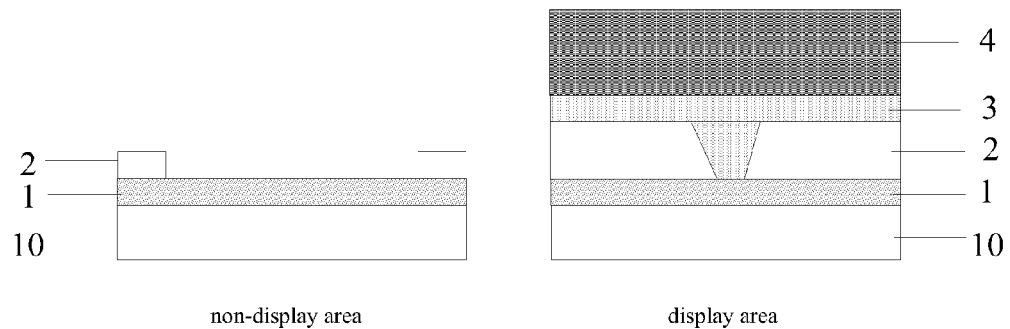
FIG. 7 is a schematic structural view illustrating removing the protection layer in the non-display area according to the embodiments of the present disclosure.

Referring to FIG. 7, the protection layer 2 that is not covered by the pixel defining layer 4 in the non-display area is removed and the first electrode 1 in the non-display area is exposed.

In the fabrication process of the array substrate according to the embodiments of the present disclosure, the protection layer is formed on the metal layer in the non-display area of the array substrate before the display electrode layer is formed; the display electrode layer is formed after the protection layer is formed. The protection layer, in an etching process to form the display electrode layer, prevents etching solution from corroding the metal layer and insulates the display electrode layer from the metal layer to avoid oxidization of the metal layer caused by primary cell effect; in this way, a problem that the metal layer is damaged is avoid. In addition, it is not needed to develop material for the protection layer additionally, which is easily realized and of low cost.

The embodiments of the present disclosure further provide an array substrate. For example, the array substrate is fabricated by the fabricating method according to the embodiments above.

For example, a thickness of the first electrode is 1000 angstrom to 5000 angstrom.

For example, a thickness of the display electrode layer is 1000 angstrom to 5000 angstrom.

The embodiments of the present disclosure further provide a display panel, comprising the array substrate according to the embodiments as described above.

The embodiments of the present disclosure further provide a display device, comprising the array substrate according to the embodiments as described above. For example, the display device is any product or component having display function such as an electronic paper, a cell phone, a tablet computer, a TV set, a display, a laptop computer, a digital photo frame and a navigator.

The foregoing embodiments merely are exemplary embodiments of the present disclosure, and not intended to define the scope of the present disclosure, and the scope of the present disclosure is determined by the appended claims.

This application claims the benefit of Chinese patent application No. 201510263070.0 filled in China on May 21, 2015, which is incorporated by reference herein as a part of this application.

The invention claimed is:

1. A method for fabricating an array substrate, the array substrate comprising a display area and a non-display area that is outside the display area, wherein the method comprises:

forming a metal layer on a base substrate, the metal layer comprising a conductive pattern in the display area and a first electrode in the non-display area;

forming a protective layer on the metal layer, a thickness of the protection layer in the non-display area being less than a thickness of the protection layer in the display area;

forming a display electrode layer on the protection layer and removing the display electrode layer only in the non-display area; and removing the protection layer in the non-display area.

2. The method for fabricating the array substrate according to claim 1, wherein the forming the metal layer on the base substrate comprises:

forming a metal film with a single-layered structure formed of any one of aluminum, molybdenum and tungsten, or forming the metal film with a multi-layered structure formed of at least two of aluminum, molybdenum and tungsten, or forming the metal film of an alloy of at least two of aluminum, molybdenum and tungsten; and performing a patterning process on the metal film to form the metal layer that comprises the conductive pattern and the first electrode.

3. The method for fabricating the array substrate according to claim 1, wherein the first electrode in the non-display area is connected with the conductive pattern in the display area to connect the conductive pattern in the display area with an outside circuit.

4. The method for fabricating the array substrate according to claim 1, wherein
the metal layer is a source-drain electrode metal layer;
the conductive pattern in the display area comprises a source electrode and a drain electrode of a thin film transistor and a data line; and
the first electrode is connected with the data line to connect the data line with an outside drive circuit.

5. The method for fabricating the array substrate according to claim 1, wherein
the metal layer is a gate metal layer;
the conductive pattern in the display area comprises a gate electrode of a thin film transistor and a gate line; and
the first electrode is connected with the gate line to connect the gate line with an outside drive circuit.

6. The method for fabricating the array substrate according to claim 1, wherein the forming the protection layer on the metal layer comprises:
forming a planarization film on the metal layer and performing patterning of the planarization film via a half-tone mask, so that the protection layer is formed and the thickness of the protection layer in the non-display area is less than the thickness of the protection layer in the display area.

7. The method for fabricating the array substrate according to claim 6, wherein the planarization film is formed of an organic photoresist material.

8. The method for fabricating the array substrate according to claim 1, wherein the thickness of the protection layer in the display area is 8000 angstrom to 20000 angstrom and the thickness of the protection layer in the non-display area is 1000 angstrom to 8000 angstrom.

9. The method for fabricating the array substrate according to claim 1, wherein the forming the display electrode layer on the protection layer and removing the display electrode layer in the non-display area comprises:
forming a electrode film on the protection layer and performing patterning of the electrode film via a patterning process to form the display electrode layer and removing the display electrode layer in the non-display area.

10. The method for fabricating the array substrate according to claim 1, wherein
the protection layer is formed of an organic photoresist material; and
the removing the protection layer in the non-display area comprises: removing the protection layer in the non-display area via an ashing process.

11. The method for fabricating the array substrate according to claim 1, further comprising: forming a pixel defining layer on the display electrode layer, wherein
the removing the protection layer in the non-display area comprises: removing the protection layer that is not covered by the pixel defining layer within the non-display area by taking the pixel defining layer as an mask.

12. The method for fabricating the array substrate according to claim 11, wherein
the protection layer is formed of an organic photoresist material; and
the removing the protection layer in the non-display area comprises: removing the protection layer that is not covered by the pixel defining layer within the non-display area by taking the pixel defining layer as an mask and by an ashing process.

* * * * *